United States Patent [19]
Hassoun

[11] Patent Number: 6,061,418
[45] Date of Patent: May 9, 2000

[54] VARIABLE CLOCK DIVIDER WITH SELECTABLE DUTY CYCLE

[75] Inventor: Joseph H. Hassoun, Los Gatos, Calif.

[73] Assignee: Xilinx, Inc., San Jose, Calif.

[21] Appl. No.: 09/103,172

[22] Filed: Jun. 22, 1998

[51] Int. Cl.$^7$ ............................................ H03K 1/04
[52] U.S. Cl. ........................... 377/47; 327/115; 327/299
[58] Field of Search ................................. 327/115, 117, 327/217, 299; 377/47

[56] References Cited

U.S. PATENT DOCUMENTS

| | | | |
|---|---|---|---|
| 3,976,949 | 8/1976 | Hepworth et al. | 328/206 |
| 4,330,751 | 5/1982 | Swain | 328/61 |
| 4,621,341 | 11/1986 | New | 364/900 |
| 4,686,386 | 8/1987 | Tadao | 307/269 |
| 4,894,557 | 1/1990 | Beltramini | 307/291 |
| 5,065,052 | 11/1991 | Sakagami et al. | 307/480 |
| 5,075,640 | 12/1991 | Miyazawa | 331/10 |
| 5,086,387 | 2/1992 | Arroyo et al. | 395/550 |
| 5,359,232 | 10/1994 | Eitrheim et al. | 307/268 |
| 5,528,181 | 6/1996 | Suggs | 377/48 |
| 5,589,782 | 12/1996 | Sharpe-Geisler | 326/38 |
| 5,590,163 | 12/1996 | Dufour | 377/47 |
| 5,754,489 | 5/1998 | Kim | 365/221 |
| 5,844,844 | 12/1998 | Bauer et al. | 365/189.05 |

FOREIGN PATENT DOCUMENTS 63-232615   9/1988   Japan .

OTHER PUBLICATIONS

M. Afghahi and J. Yuan, "Double Edge–Triggered D–Flip–Flops for High Speed CMOS Circuits"; IEEE Journal of Solid State Circuits, vol. 26, No. 8, pp. 1168–1170, Aug. 1991.

Stephen H. Unger, "Double–Edge–Triggered Flip–Flops"; IEEE Transactions on Computers, vol. C–30, No. 6, pp. 447–451, Jun. 1981.

Shih–Lien Lu and Milos Ercegovac, "A Novel CMOS Implementation of Double–Edge–Triggered Flip–Flops", IEEE Journal of Solid–State Circuits, vol. 25, No. 4, pp. 1008–1010, Aug. 1990.

Microelectronics Group, Lucent Technologies, Inc., Preliminary Data Sheet, May 1998, ORCA OR3Cxx (5 V), and OR3Txxx (3.3 V) Series Field–Programmable Gate Arrays, pp. 3, 69–80 available from Microelectronics Group, Lucent Technologies, Inc., 555 Union Boulevard, Room 30L–15P–BA, Allentown, PA 18103.

"Actel ES Family Digital Phase Lock Loop Usage", by Joe Landry, Sep. 17, 1996, pp. 1–5, available from Actel Corp., 955 East Arques Avenue, Sunnyvale, California 94086.

Shih–Lien Lu, "A Safe Single–Phase Clocking Scheme for CMOS Circuits", IEEE Journal of Solid–State Circuits, vol. 23, No. 1, pp. 280–283, Feb. 1988.

Neil Weste and Kamran Eshraghian, "Principles of CMOS VLSI Design, A Systems Persepective", Second Edition, Addison Wesley Publishing Company, Copyright 1993, pp. 328–329.

*Primary Examiner*—Margaret R. Wambach
*Attorney, Agent, or Firm*—Edward S. Mao, Esq.; Bever, Hoffman & Harms; Lois D. Cartier

[57] ABSTRACT

A variable clock divider circuit is provided. The variable clock divider circuit receives an input clock signal and generates an output clock signal having an output clock frequency that is less than the input clock frequency of the input clock signal. In one embodiment, a controller generates a rising-edge control signal and a falling-edge control signal. An output generator drives rising edges on the output clock signal in response to active edges on the rising-edge control signal. Conversely, the output generator drives falling edges on the output clock signal in response to active edges on the falling-edge control signal. The frequency of the rising-edge control signal and the frequency of the falling-edge control signal are variable. Common settings for the frequency of the rising-edge control signal and the falling-edge control signal include the frequency of the input clock signal divided by an integer.

18 Claims, 10 Drawing Sheets

VARIABLE CLOCK DIVIDER WITH SELECTABLE DUTY CYCLE

CROSS-REFERENCE TO RELATED APPLICATION

This application relates to the following commonly assigned, concurrently filed U.S. patent applications:

Ser. No. 09/102,966, "Edge Triggered SR Circuit" by Goetting; and

Ser. No. 09/102,740, "Delay Lock Loop With Clock Phase Shifter" by Goetting et al, which are incorporated herein by reference.

FIELD OF THE INVENTION

The present invention relates to clocking circuits for digital systems. More specifically, the present invention relates to a variable clock divider that generates an output clock signal having a selectable duty cycle.

BACKGROUND OF THE INVENTION

Digital circuits such as board level systems and integrated circuit (IC) devices, including field programmable gate arrays (FPGAs) and microprocessors, use clocking signals for a variety of reasons. For example, synchronous systems use global clock signals to synchronize various circuits across the board or IC device. However, as the complexity of digital circuits increases, clocking schemes for synchronous systems become more complicated. Many complex digital circuits such as microprocessors and FPGAs have multiple clock signals at different frequencies. For example, in some microprocessors, internal circuits are clocked by a first clock signal at a first frequency while input/output (I/O) circuits are clocked by a second clock signal at a second frequency. Typically, the second frequency is slower than the first frequency.

Multiple clock generating circuits can be used to generate the multiple clock signals; however, clock generating circuits typically consume a large amount of device or board space. Therefore, most systems use one clock generating circuit to generate a first clock signal and a specialized circuit to derive other clock signals from the first clock signal. For example, clock dividers are used to generate one or more clock signals of lower clock frequencies from an input clock signal.

Figure 1A:
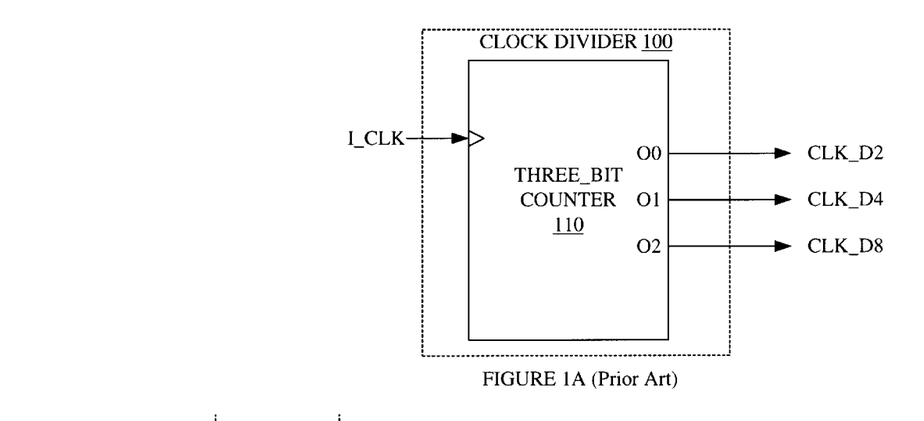
FIG. 1A is a block diagram of a conventional clock divider.

FIG. 1A shows a conventional clock divider 100 that receives an input clock signal I_CLK and generates a divided-by-two clock signal CLK_D2, a divided-by-four clock signal CLK_D4, and a divided-by-eight clock signal CLK_D8. Clock divider 100 comprises a three-bit counter 110. Input clock signal I_CLK is applied to the clock terminal of three-bit counter 110. Three-bit counter 110 drives clock signals CLK_D2, CLK_D4, and CLK_D8 on output terminals O0, O1, and O2, respectively. Output terminal O0 is the least significant bit, output terminal O1 is the second least significant bit, and output terminal O2 is the most significant bit of three-bit counter 110.

Figure 1B:
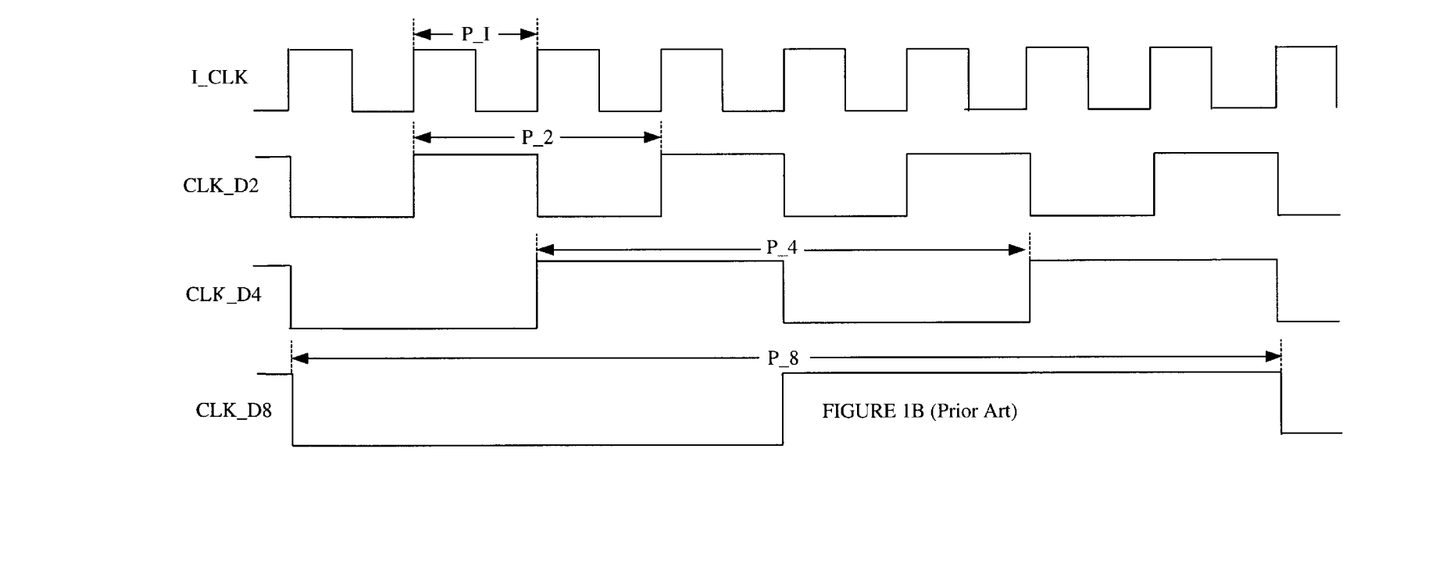
FIG. 1B is a timing diagram for the conventional clock divider of FIG. 1A.

FIG. 1B is a timing diagram for clock divider 100. As shown in FIG. 1B, input clock signal I_CLK has a clock period P_I. Clock period P_2 of divide-by-two clock signal CLK_D2 is twice as long as clock period P_I. Thus the frequency of clock signal CLK_D2 is half the frequency of input clock signal I_CLK. Similarly, clock periods P_4 and P_8 are four times and eight times as long as clock period P_I, respectively. Thus, the frequencies of clock signals CLK_D4 and CLK_D8 are one-fourth and one-eighth the frequency of input clock signal I_CLK, respectively.

In many digital systems, fixed clock divider circuits such as clock divider 100 do not provide enough flexibility. For example, an FPGA that operates internally with a clock rate of 100 MHz might be coupled to an external circuit that operates at a maximum rate of 33.3 MHz. Thus, a clock division circuit in the FPGA would need to divide the internal 100 MHz clock by three to operate with the external circuit. However, the same FPGA may be coupled to a second external circuit, which operates at a maximum rate of 50 MHz. For maximum performance of the second external circuit, the clock division circuit in the FPGA would need to divide the internal 100 MHz clock by two. Clock divider 100 is incapable both of dividing a clock frequency by three and of generating a variable output signal. Therefore, there is a need for a variable clock divider that generates an output clock signal having a desired frequency, where the desired frequency is a fraction of the frequency of an input clock signal.

SUMMARY OF THE INVENTION

The invention provides a variable clock divider that is configurable to generate an output clock signal having a frequency equal to the frequency of an input clock signal divided by any integer up to a maximum integer. Further, some embodiments of the invention include circuitry to adjust the duty cycle of the output clock signal.

In one embodiment of the invention, a clock divider includes a controller that receives the input clock signal and generates a rising-edge control signal and a falling-edge control signal. The rising-edge control signal and the falling-edge control signal are provided to an output generator. The output generator drives the output clock signal. Specifically, the output generator drives rising edges on the output clock signal in response to active edges of the rising-edge control signal. Conversely, the output generator drives falling edges on the output clock signal in response to active edges on the falling-edge control signal. Active edges on the rising-edge and falling-edge control signals can be either rising edges or falling edges.

The frequency of the rising-edge control signal is adjustable. For example, in one embodiment the frequency of the rising-edge control signal is equal to the frequency of the input clock signal divided by an integer. In some embodiments, the frequency of the falling-edge control signal is equal to the frequency of the rising-edge control signal. The duty cycle of the output clock signal can be adjusted by changing the offset between the rising edges of the rising-edge and falling-edge control signals.

In a second embodiment of the present invention, the rising-edge control signal is used as an enable signal. Similarly, the falling-edge control signal is also used as an enable signal. The second embodiment includes a precision duty cycle control circuit to generate a precision rising-edge control signal and a precision falling-edge control signal. An output generator drives a rising edge on the output clock signal in response to active edges of the precision rising-edge control signal that occur while the rising-edge control signal is in an active state (i.e., logic high or logic low). The output generator ignores active edges of the precision rising-edge control signal if the rising-edge control signal is in an inactive state. Similarly, the output generator drives a falling edge on the output clock signal in response to active edges of the precision falling-edge control signal that occur while the falling-edge control signal is in an active state. The output generator ignores active edges of the precision falling-edge control signal if the falling-edge control signal is in the inactive state.

The present invention will be more fully understood in view of the following description and drawings.

DETAILED DESCRIPTION OF THE DRAWINGS

Figure 2A:
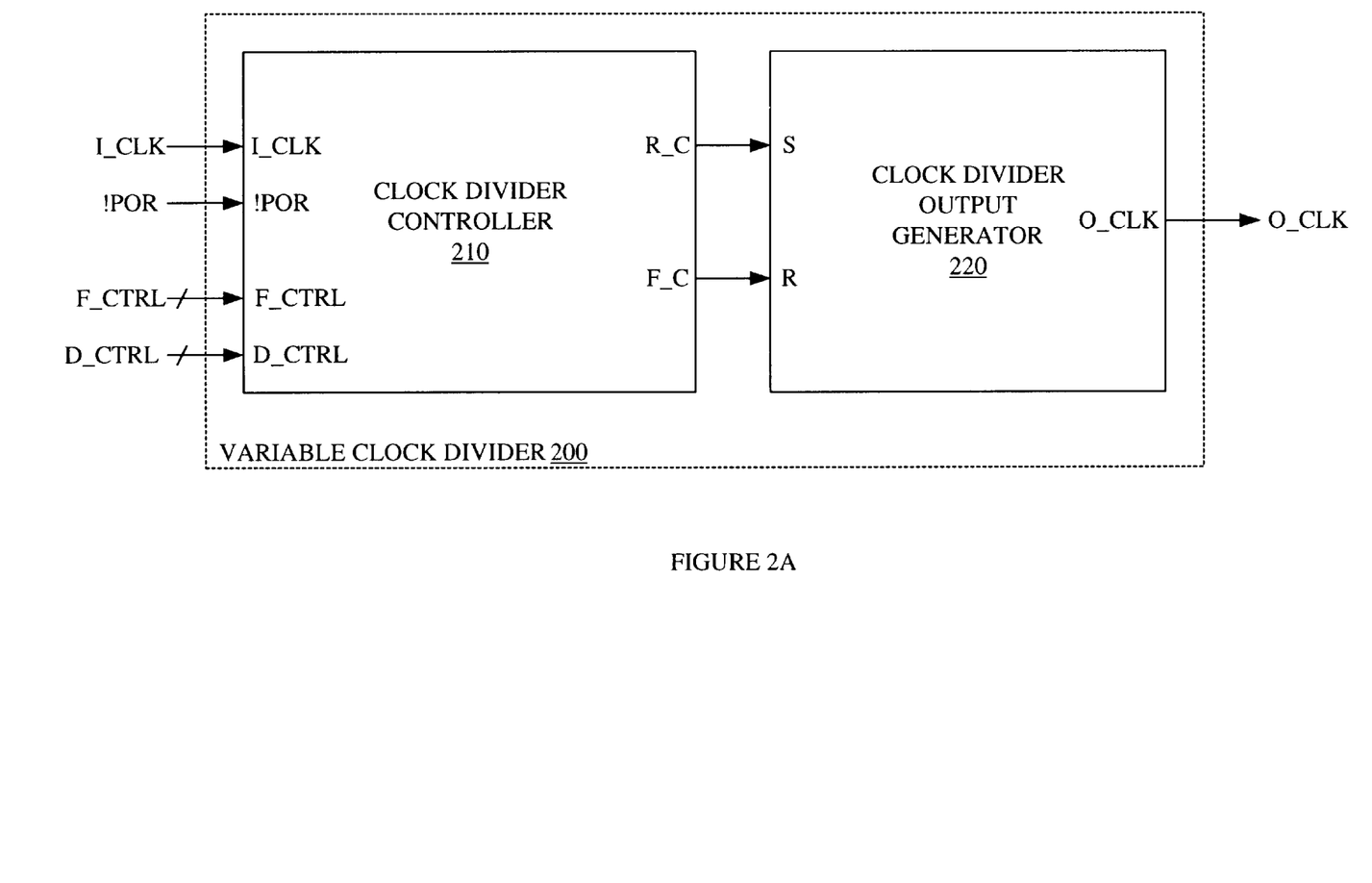
FIG. 2A is a block diagram of a clock divider in accordance with one embodiment of the present invention.

FIG. 2A is a block diagram of a variable clock divider circuit 200 in accordance with one embodiment of the present invention. Variable clock divider circuit 200 comprises a clock divider controller 210 and a clock divider output generator 220. Clock divider controller 210 comprises an input clock terminal I_CLK, an active-low power-on/reset terminal !POR, frequency control terminals F_CTRL, duty cycle control terminals D_CTRL, a rising-edge control terminal R_C, and a falling-edge control terminal F_C. Clock divider output generator 220 comprises a set terminal S, which is coupled to rising-edge control terminal R_C, a reset terminal R, which is coupled to falling-edge control terminal F_C, and an output clock terminal O_CLK. To avoid confusion, terminals are referred to with the same identifier as the signals driven by the terminal. For example, output clock terminal O_CLK drives an output clock signal O_CLK. Further, terminals are referred to with the same identifier as the signal received by the terminal if the terminal driving the signal is not shown. For example, input clock terminal I_CLK receives an input clock signal I_CLK, which is driven by a circuit that is not shown.

In contrast to conventional clock dividers, variable clock divider 200 generates output clock signal O_CLK having a frequency equal to a selectable fraction of the frequency of input clock signal I_CLK. The frequency of output clock signal O_CLK is selected by frequency control signals F_CTRL. Specifically, for variable clock divider 200 the frequency of output clock signal O_CLK is equal to the frequency of input clock signal I_CLK divided by an integer value between 2 and a maximum integer I_MAX.

Different embodiments of variable clock divider 200 can have different values for I_MAX. For example, in one embodiment of variable clock divider 200, I_MAX is equal to 16.

Figure 2B:
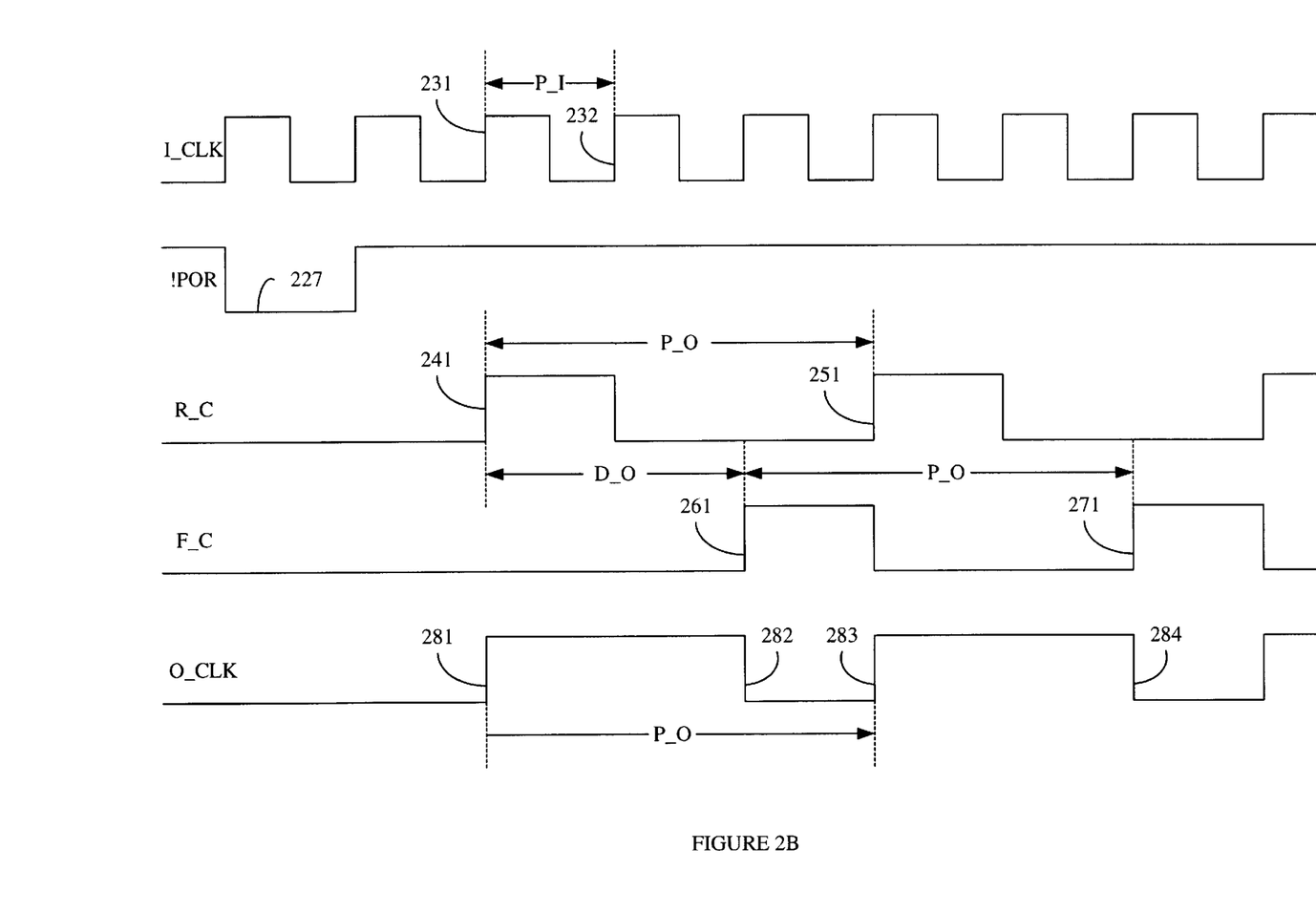
FIG. 2B is a timing diagram for the clock divider of FIG. 2A.

FIG. 2B is a timing diagram for variable clock divider 200 in accordance with one embodiment of the invention. In the example of FIG. 2B, frequency control signals F_CTRL configure variable clock divider 200 to generate output clock signal O_CLK having a frequency equal to one-third the frequency of input clock signal I_CLK. Further, duty cycle control signals D_CTRL configure variable clock divider 200 to generate output clock signal O_CLK having a duty cycle in which output clock signal O_CLK is at logic high for two-thirds of output clock period P_O. Consequently, output clock signal O_CLK is at logic low for one-third of clock period P_O of output clock signal O_CLK. For clarity, the timing diagrams depicted herein do not include any propagation delays that may exist between the various signals. However, those skilled in the art will know where propagation delays are likely to occur.

Referring to FIGS. 2A and 2B, a logic low pulse 227 on active-low power-on/reset signal !POR initializes clock divider controller 210. (Although the embodiments described herein, use active-low power-on/reset signals, other embodiments can use active-high power-on/reset signals.) Input clock signal I_CLK has an input clock period P_I (the time between two successive rising edges). Specifically, one period of input clock signal I_CLK is marked between rising edge 231 and rising edge 232 of input clock signal I_CLK. Because the frequency of output clock signal O_CLK is one-third the frequency of input clock signal I_CLK, output clock period P_O of output clock signal O_CLK is three times larger than input clock period P_I. For example, one clock period of output clock signal O_CLK is marked between rising edges 281 and 283 of output clock signal O_CLK.

Clock divider controller 210 generates active edges on rising-edge control signal R_C at a frequency equal to the frequency desired for output clock signal O_CLK. (For clarity, all the examples herein use rising edges for the active edges. However, other embodiments can use falling edges for the active edges.) Thus, the time period between rising edge 241 and rising edge 251 of rising-edge control signal R_C is equal to output clock period P_O. Similarly, clock divider controller 210 generates rising edges on falling-edge control signal F_C at a frequency equal to the frequency desired for output clock signal O_CLK. Thus, the time period between rising edges 261 and 271 of falling-edge control signal F_C is also equal to output clock period P_O.

Clock divider output generator 220 generates rising edges on output clock signal O_CLK in response to rising edges of rising-edge control signal R_C. Thus, clock divider output generator 220 drives a rising edge 281 on output clock signal O_CLK in response to rising edge 241 and a rising edge 283 on output clock signal O_CLK in response to rising edge 251. Similarly, clock divider output generator 220 generates falling edges on output clock signal O_CLK in response to active(rising) edges of falling-edge control signal F_C. Thus, clock divider output generator 220 drives a falling edge 282 on output clock signal O_CLK in response to rising edge 261 and a falling edge 284 in response to rising edge 271.

During the time after a rising edge of rising-edge control signal R_C but before a rising edge of falling-edge control signal F_C, output clock signal O_CLK is at the logic high state. Conversely, during the time after a rising edge of falling-edge control signal F_C but before a rising edge of rising-edge control signal R_C, output clock signal O_CLK is at the logic low state. Thus, the duty cycle of output clock signal O_CLK can be controlled by adjusting a duty cycle offset D_O between a rising edge of rising-edge control signal R_C and a rising edge of falling-edge control signal F_C. Duty cycle offset D_O is controlled by duty cycle control signals D_CTRL (FIG. 2A). Since the example of FIG. 2B displays a duty cycle with output clock signal O_CLK at logic high for two-thirds of output clock period P_O, duty cycle offset D_O is two-thirds of output clock period P_O.

Figure 3A:
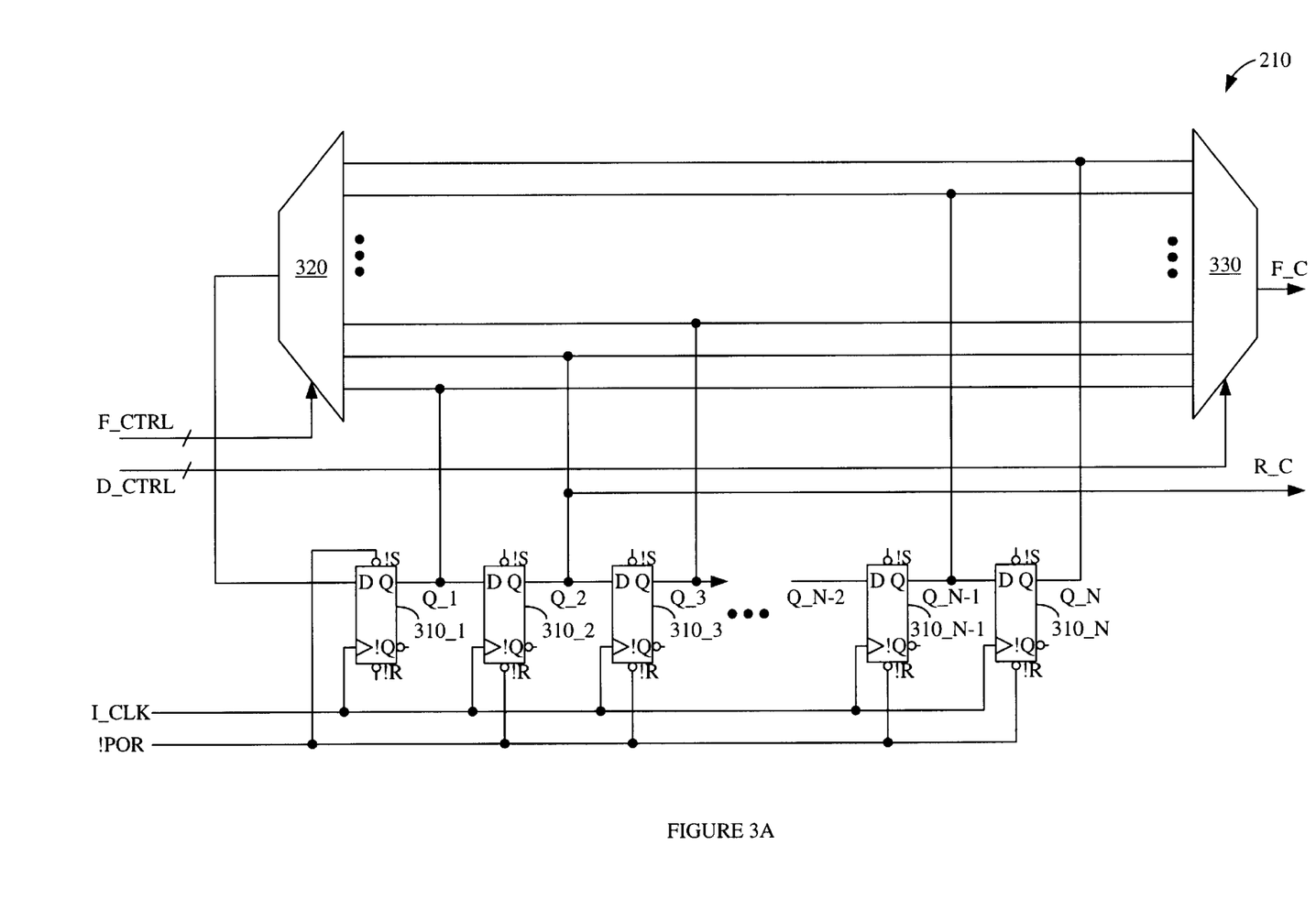
FIG. 3A is schematic diagram of a clock divider controller in accordance with one embodiment of the present invention.

FIG. 3A is a schematic diagram of one embodiment of clock divider controller 210 of FIG. 2A. The embodiment of FIG. 3A comprises a feedback multiplexer 320, an output multiplexer 330, and D-type flip-flops 310_1, 310_2, ..., 310_N–1, and 310_N. Flip-flops 310_1, 31_2, ..., 310_N–1, and 310_N are coupled in series so that an output terminal Q of flip-flop 310_X is coupled to an input terminal D of flip-flop 310_X+1, where X is an integer between 1 and N–1, inclusive. In addition, each output terminal Q of flip-flops 310_1 to 310_N is coupled to an input terminal of feedback multiplexer 320 and an input terminal of output multiplexer 330. The output terminal of feedback multiplexer 320 is coupled to input terminal D of flip-flop 310_1. The clock terminals of flip-flop 310_1 to 310_N are driven by input clock signal I_CLK. Active-low set terminal !S of flip-flop 310_1 is driven by active-low power-on/reset signal !POR. Active-low reset terminals !R of flip-flops 310_2 to 310_N are driven by power-on/reset signal !POR. Frequency control signals F_CTRL are applied to the select terminals of feedback multiplexer 320. Duty cycle control signals D_CTRL are applied to the select terminals of output multiplexer 330. Output multiplexer 330 drives falling-edge control signal F_C. In the embodiment of FIG. 3A, flip-flop 310_2 drives rising-edge control signal R_C. However, in other embodiments rising-edge control signal R_C can be driven by another flip-flop such as flip-flop 310_1. Further, some embodiments of clock divider controllers 210 may use output multiplexer 330 to drive rising-edge control signal R_C and use one of the flip-flops to drive falling-edge control signal F_C.

Figure 3B:
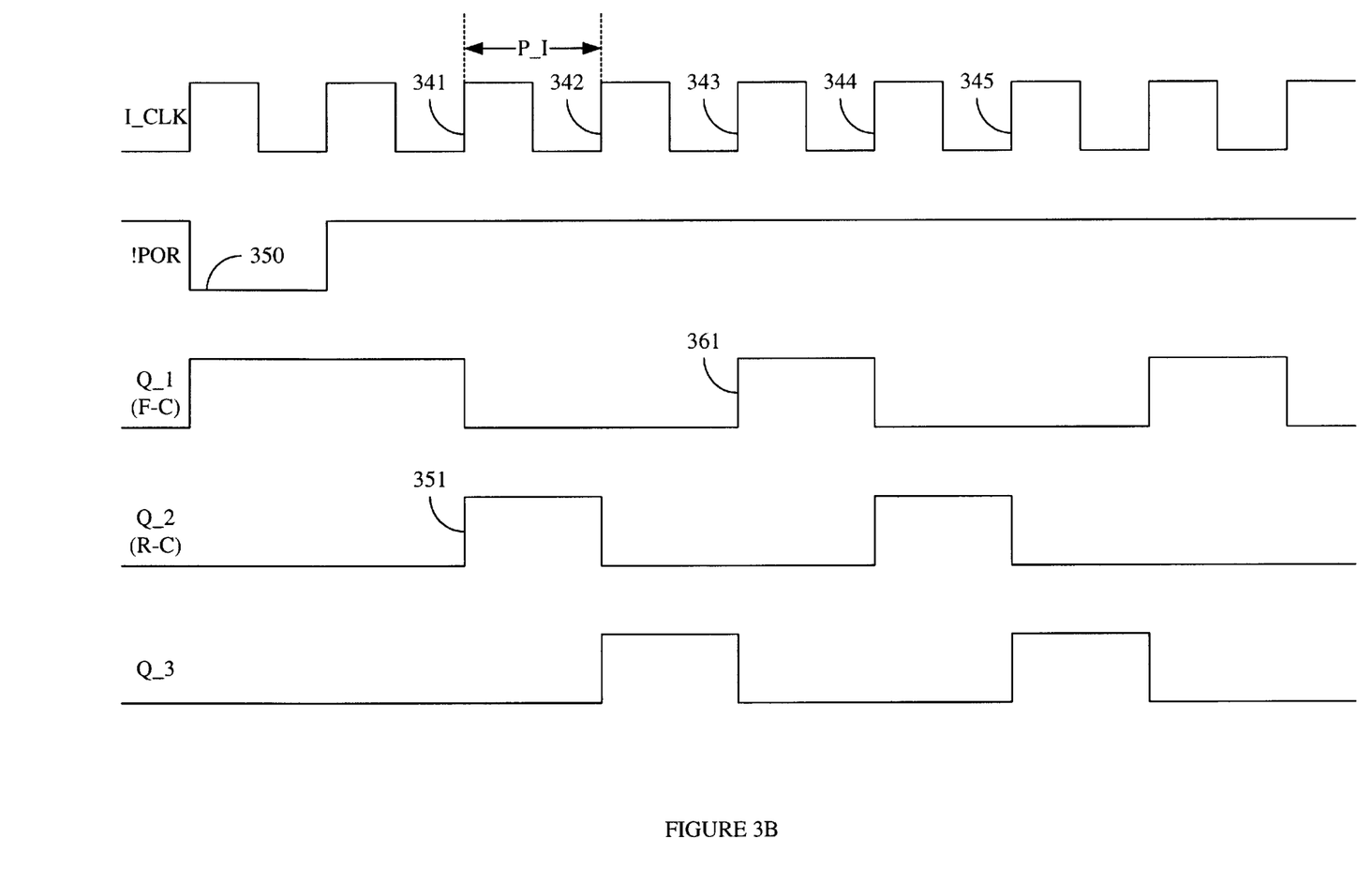
FIG. 3B is a timing diagram for the clock divider controller of FIG. 3A.

Frequency control signals F_CTRL configure feedback multiplexer 320 so that output terminal Q of flip-flop 310_F is coupled to input terminal D of flip-flop 310_1, where F is an integer between 2 and N, inclusive. Flip-flops 310_1 to 310_F form a clocking ring. FIG. 3B is a timing diagram that illustrates the function of the embodiment of FIG. 3A with F equal to three. During and following a power-on/reset pulse 350 on active-low power-on/reset signal !POR, output signal Q_1 of flip-flop 310_1 is in a logic high state. Output signal Q_2 to Q_N of flip-flops 310_2 to 310_N are in the logic low state. Note that because F is equal to three, only output signals Q_1, Q_2, and Q_3 (i.e., Q_F) are illustrated.

At each rising edge of input clock signal I_CLK, flip-flop 310_X loads the output of flip-flop 310_X–1, where X is an integer between 2 and N, inclusive. However, flip-flop 310_1 loads the output of flip-flop 310_F. Thus, at rising edge 341 of input clock signal I_CLK, output signal Q_1 transitions to logic low and output signal Q_2 transitions to logic high. At rising edge 342 of input clock signal I_CLK, output signal Q_2 transitions to logic low and output signal Q_3 transitions to logic high. Then, at rising edge 343 of input clock signal I_CLK, output signal Q_1 transitions to logic high and output signal Q_3 transitions to logic low.

Thus in general, each output signal Q_X (where X is an integer between 1 and F, inclusive) has a period (i.e., the time between two rising edges) equal to F times input clock period P_I of input clock signal I_CLK. Therefore, each output signal Q_X, where X is an integer between 1 and F inclusive, has a frequency equal to the frequency of input clock signal I_CLK divided by F. Further, each output signal Q_X is offset from Q_((X+1) MOD F) and Q_((X–1) MOD F) by input clock period P_I. (As used herein, I MOD J is equal to the remainder of I divided by J, where I and J are both integers.)

Duty cycle control signals D_CTRL control output multiplexer 330 to determine which output signal Q_1 to Q_F is selected for falling-edge control signal F_C. As explained above, a rising edge on rising-edge control signal R_C causes a rising edge on output clock signal O_CLK. Conversely, a rising edge on falling-edge control signal F_C causes a falling edge on output clock signal O_CLK. Thus, to set the duty cycle of output clock signal O_CLK to two-thirds logic high and one-third logic low (i.e. the same as the example in FIG. 2B), a rising edge must occur on falling-edge control signal F_C two input clock periods (P_I) after a rising edge on rising-edge control signal R_C. Thus, in this example duty cycle control signals D_CTRL must configure output multiplexer 330 to drive output signal Q_1 as falling-edge control signal F_C because rising edge 361 of output signal Q_1 occurs two input clock periods P_I after rising edge 351 of output signal Q_2, which is driven as rising-edge control signal R_C.

For the embodiment of FIG. 3A, to set the duty cycle of output clock signal O_CLK to be logic high for H input clock periods, duty cycle control signals D_CTRL must configure output multiplexer 330 to use output signal Q_X as falling-edge control signal F_C, where X is equal to ((2+H) MOD F). For the example of FIG. 2B, F is equal to three, and H is equal to 2, and ((2+H) MOD F) is equal to 1. Thus, output signal Q_1 is selected as falling-edge control signal F_C.

Figure 4:
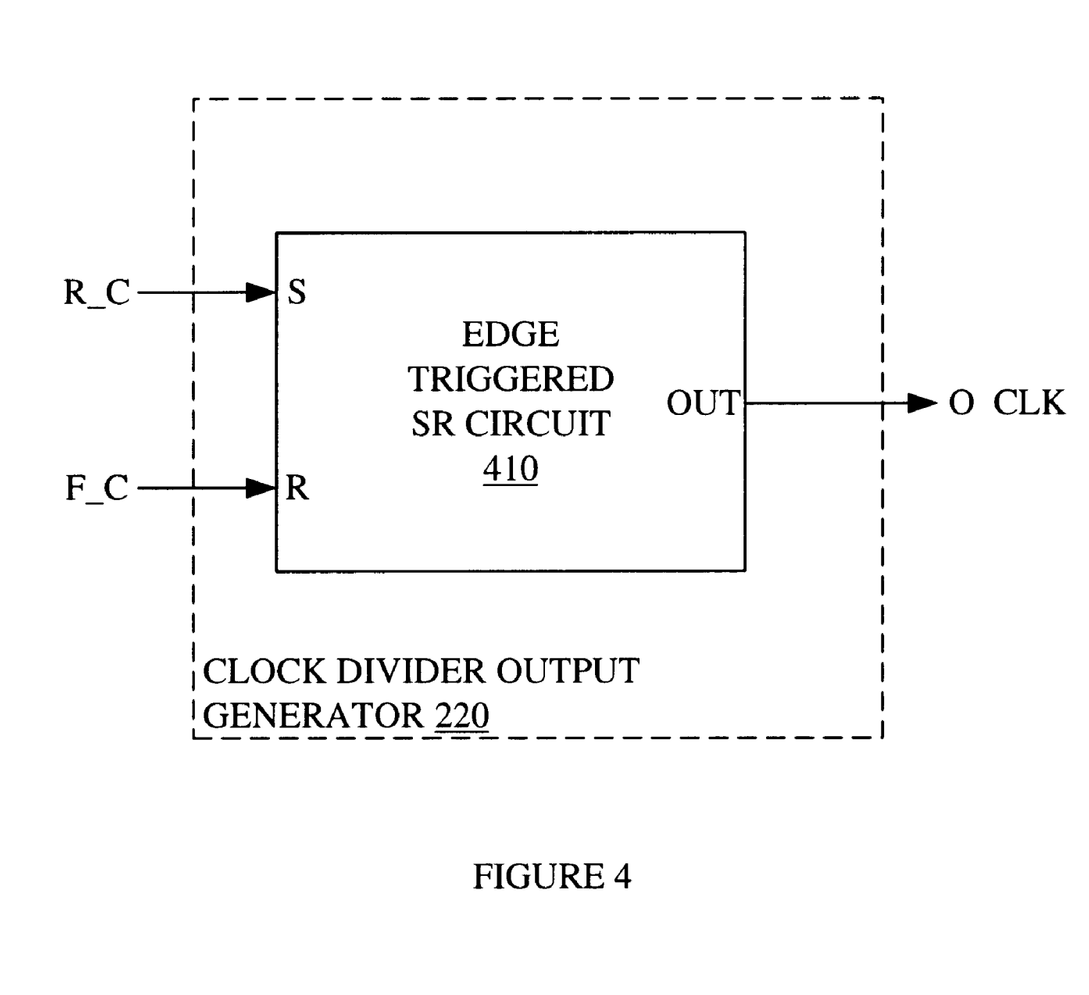
FIG. 4 is block diagram of a clock divider output generator in accordance with one embodiment of the present invention.

FIG. 4 shows an embodiment of clock divider output generator 220 of FIG. 2A, comprising an edge-triggered Set/Reset (SR) circuit 410. Edge-triggered SR circuit 410 drives an output clock signal on output terminal OUT to a logic high state in response to an active edge of a set signal applied to a set terminal S. Edge-triggered SR circuit 410 drives an output signal on output terminal OUT to a logic low state in response to an active edge of a reset signal applied to a reset terminal R. Edge-triggered SR circuit 410 is described in U.S. patent application Ser. No. 09/102,966 [docket X-443 US], entitled "Edge Triggered SR Circuit", which is referenced above.

Edge-triggered SR circuit 410 is controlled by rising-edge control signal R_C, which is applied to set terminal S, and by falling-edge control signal F_C, which is applied to reset terminal R. Thus, as indicated in FIG. 2B, in response to rising edges 241 and 251 of rising-edge control signal R_C, edge-triggered SR circuit 410 drives output clock signal O_CLK to a logic high value. Conversely, in response to rising edges 261 and 271 of falling-edge control signal F_C, edge-triggered SR circuit 410 drives output clock signal O_CLK to a logic low value.

Figure 5:
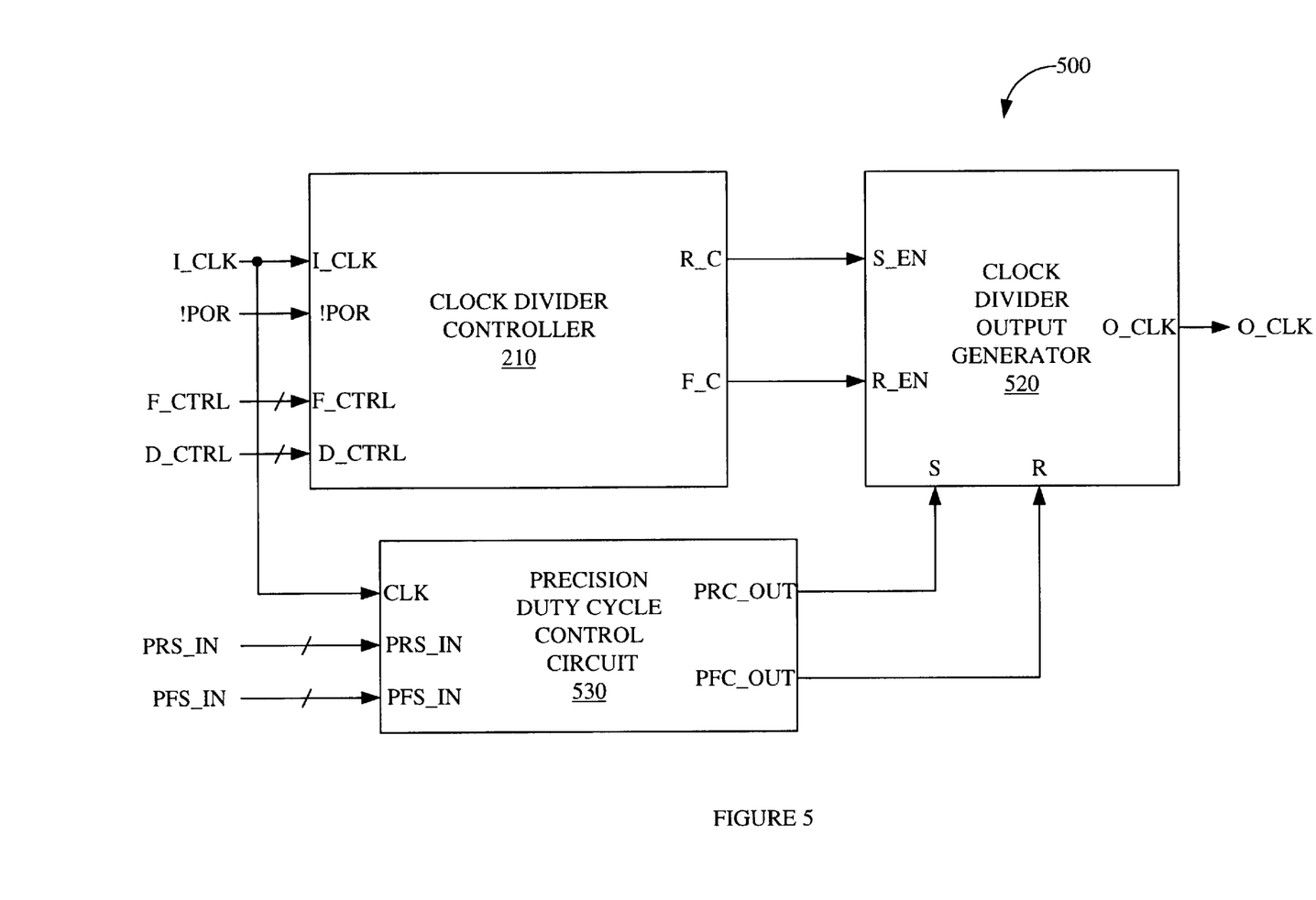
FIG. 5 is a block diagram of a variable clock divider circuit in accordance with a second embodiment of the present invention.

FIG. 5 is a block diagram of a variable clock divider circuit 500 in accordance with a second embodiment of the present invention. Variable clock divider circuit 500 comprises clock divider controller 210, a clock divider output generator 520, and a precision duty cycle control circuit 530. As described above with respect to FIGS. 2A and 2B, duty cycle control signals D_CTRL provide a rough control on the duty cycle of output clock signal O_CLK. Specifically, duty cycle control signals D_CTRL can control the duration of output clock signal O_CLK in the logic high state to a multiple of clock period P_I of input clock signal I_CLK. Precision duty cycle control circuit 530 can control the duration of output clock signal O_CLK in the logic high state to a fractional portion of clock period P_I of input clock signal I_CLK.

As described above, clock divider controller 210 comprises an input clock terminal I_CLK, an active-low power-on/reset terminal !POR, frequency control terminals F_CTRL, duty cycle control terminals D_CTRL, a rising-edge control terminal R_C and a falling-edge control terminal F_C. Clock divider output generator 520 differs from clock divider output generator 220 because clock divider output generator 520 comprises a set enable terminal S_EN, which is coupled to rising-edge control terminal R_C, and a reset enable terminal R_EN, which is coupled to falling-edge control terminal F_C. Clock divider output generator 520 also comprises a set terminal S, a reset terminal R, and an output terminal O_CLK. Precision duty cycle control circuit 530 comprises a clock input terminal I_CLK, which receives input clock signal I_CLK; precision rising-edge selection input terminals PRS_IN, which receive precision rising-edge selection signals PRS_IN; precision falling-edge selection input terminals PFS_IN, which receive precision falling-edge selection signals PFS_IN; a precision rising-edge control output terminal PRC_OUT, which is coupled to set terminal S of clock divider output generator 520; and a precision falling-edge control output terminal PFC_OUT, which is coupled to reset terminal R of clock divider output generator 520.

As explained above, clock divider controller 210 drives logic high pulses having a width equal to one input clock period P_I of input clock signal I_CLK on rising-edge control signal R_C and on falling-edge control signal F_C. Unlike variable clock divider circuit 200, clock divider circuit 500 uses falling-edge control signal F_C and rising-edge control signal R_C as enable signals rather than clocking signals, as explained in detail below.

If rising-edge control signal R_C (which is applied to set enable terminal S_EN) is at a logic high state, and a rising edge occurs on precision rising-edge control signal PRC_OUT (which is applied to set terminal S), clock divider output generator 520 drives output clock signal O_CLK on output terminal O_CLK to a logic high state. Conversely, if falling-edge control signal F_C (which is applied to reset enable terminal R_EN) is at a logic high state, and a rising edge occurs on precision falling-edge control signal PFC_OUT (which is applied to reset terminal R), clock divider output generator 520 drives output clock signal O_CLK on output terminal O_CLK to a logic low state.

Figure 6:
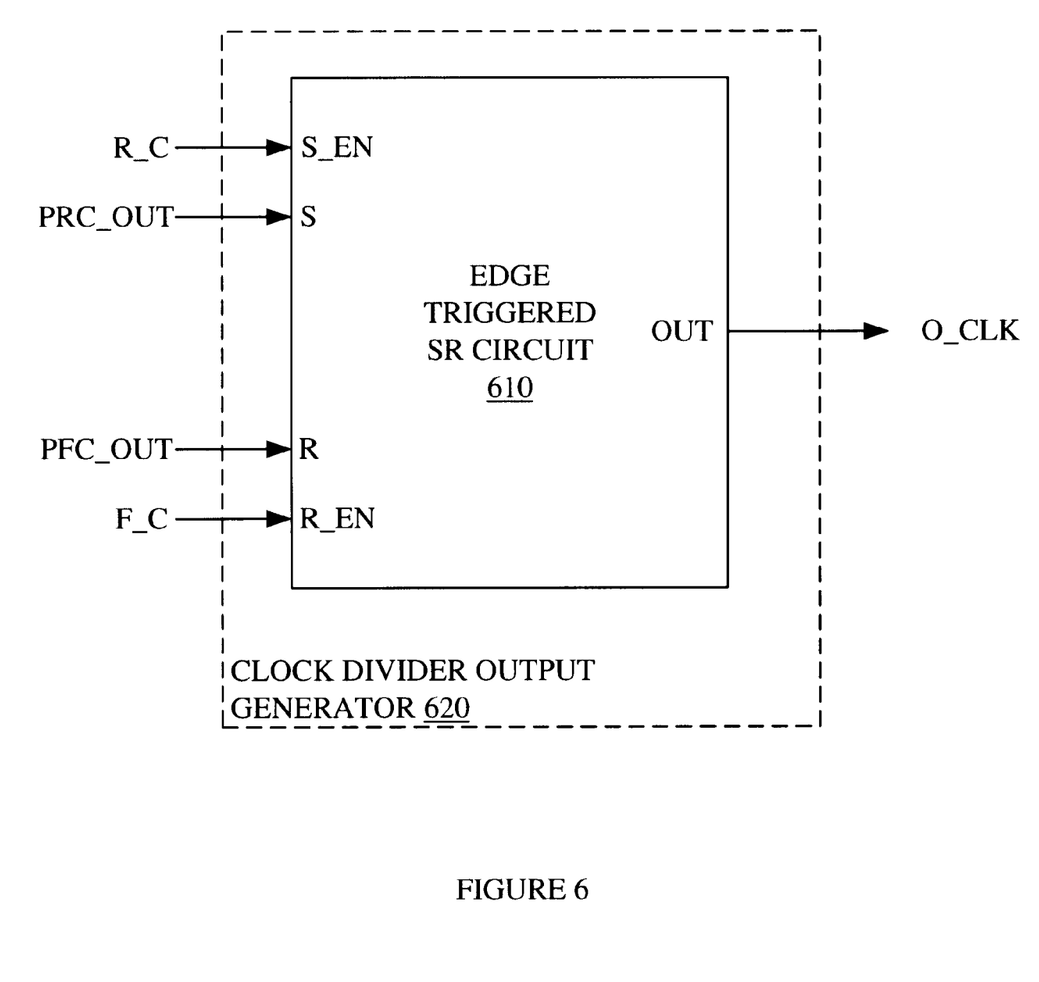
FIG. 6 is a block diagram of a clock divider output generator in accordance with one embodiment of the present invention.

FIG. 6 shows a block diagram of clock divider output generator 520 in accordance with one embodiment of the present invention. The embodiment of FIG. 6 comprises an edge-triggered Set/Reset (SR) circuit 610. Edge-triggered SR circuit 610 drives an output signal on output terminal OUT to a logic high state in response to an active edge of a set signal applied to a set terminal S if an enable signal applied to a set enable terminal S_EN is at the logic high state (the active state). Edge-triggered SR circuit 610 drives the output signal on output terminal OUT to a logic low state in response to an active edge of a reset signal applied to a reset terminal R if a reset enable signal applied to a reset enable terminal R_EN is at the logic high state. Edge-triggered SR circuit 610 is described in U.S. patent application Ser. No. 09/102,966 [docket X-443 US], entitled "Edge Triggered SR Circuit", which is referenced above. In the embodiment of FIG. 6, edge-triggered SR circuit 610 drives output clock signal O_CLK on output terminal OUT. Edge-triggered SR circuit 610 is controlled by rising-edge control signal R_C, which is applied to set enable terminal S_EN; by precision rising-edge control signal PRC_OUT, which is applied to set terminal S; by falling-edge control signal F_C, which is applied to reset enable terminal R_EN; and by precision falling-edge control signal PFC_OUT, which is applied to reset terminal R. A timing diagram demonstrating the functionality of edge-triggered SR circuit 610 is given in FIG. 8, which is explained in detail below.

Figure 7:
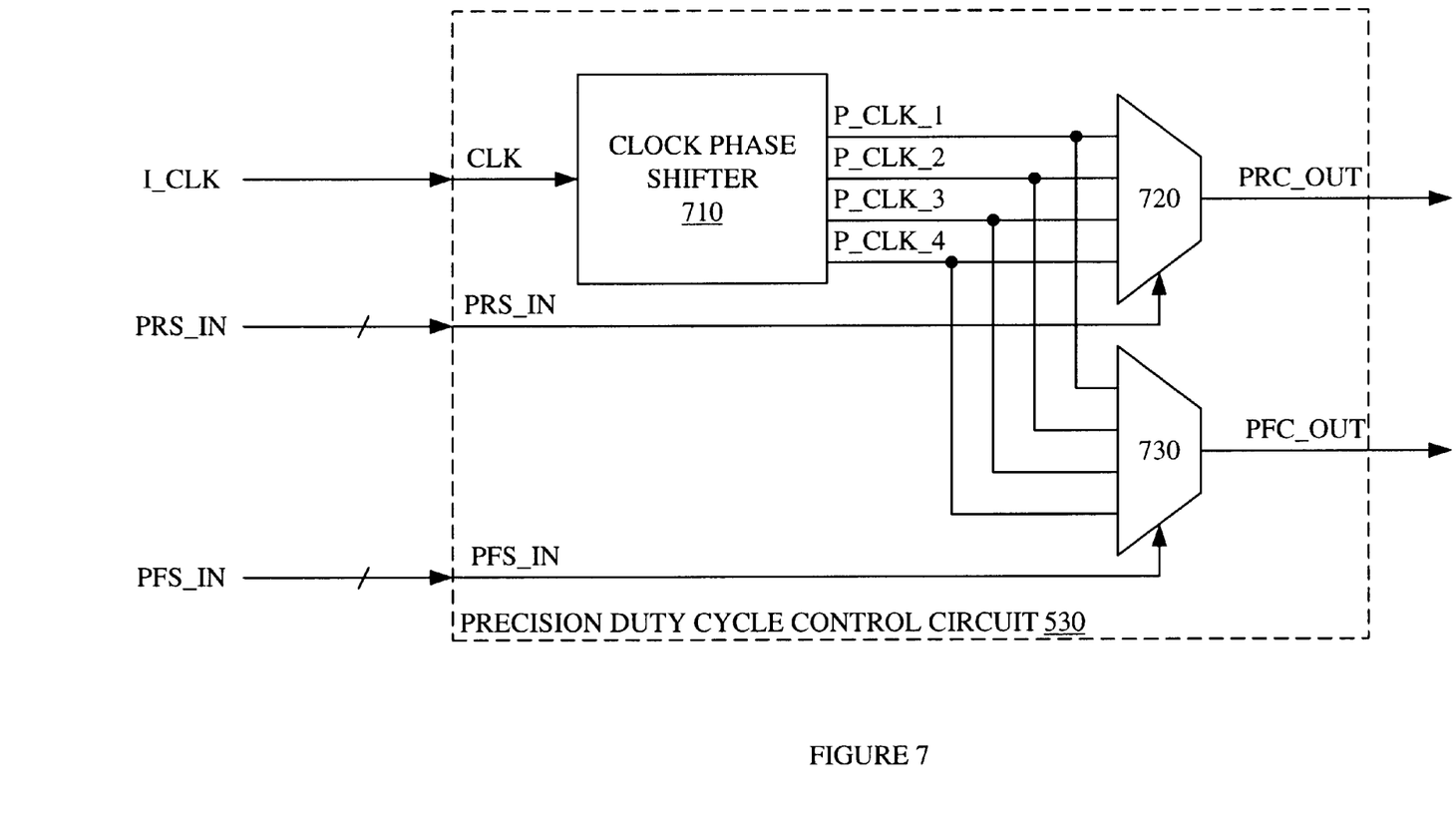
FIG. 7 is a schematic diagram of a precision duty cycle control circuit in accordance with one embodiment of the present invention.

FIG. 7 is a block diagram of precision duty cycle control circuit 530 in accordance with one embodiment of the present invention. Precision duty cycle control circuit 530 in conjunction with duty cycle control signals D_CTRL precisely control the duty cycle of output clock signal O_CLK. The embodiment of FIG. 7 comprises a clock phase shifter 710, a multiplexer 720 and a multiplexer 730. Clock phase shifter 710 generates four phase-shifted clock signals P_CLK_1, P_CLK_2, P_CLK_3 and P_CLK_4 from input clock signal I_CLK. Other embodiments of precision duty cycle control circuit 530 may use clock phase shifters that generate a different number of phase-shifted clock signals. Phase-shifted clock signals P_CLK_1 to P_CLK_4 have the same frequency as input clock signal I_CLK. However, phase-shifted clock signal P_CLK_X is phase shifted from input clock signal I_CLK by 90 degrees times X. For the embodiment of FIG. 7, X is an integer from one to four, inclusive. In general, if clock phase shifter 710 produces M phase-shifted clock signals P_CLK_1 to P_CLK_M, each phase-shifted clock signal P_CLK_X is phase shifted 360/M* X degrees, where X is an integer between 1 and M, inclusive. Clock phase shifter 710 is described in U.S. patent application Ser. No. 09/102,740 [docket X-444 US], entitled "Delay Lock Loop With Clock Phase Shifter", which is referenced above. Each of phase-shifted clock signals P_CLK_1 to P_CLK_4 is coupled to an input terminal of multiplexer 720 and an input terminal of multiplexer 730. Precision rising-edge selection signals PRS_IN control multiplexer 720 to select one of the phase-shifted clock signals to drive as precision rising-edge control signal PRC_OUT. Similarly, precision falling-edge selection signals PFS_IN control multiplexer 730 to select one of the phase-shifted clock signals to drive as precision falling-edge control signal PFC_OUT. The functionality of precision duty cycle control circuit 530 is explained below with respect to FIG. 8.

Figure 8:
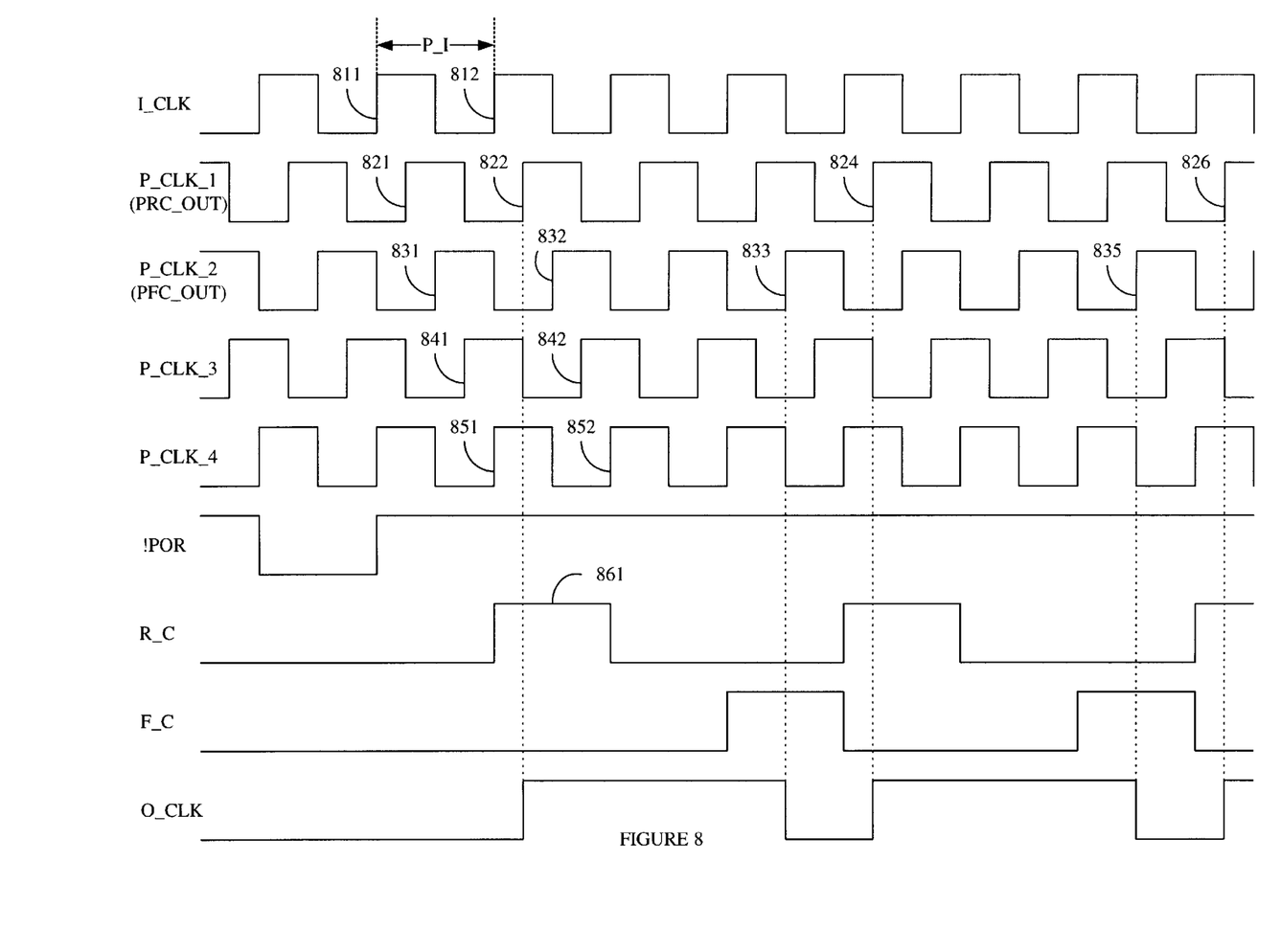
FIG. 8 is a timing diagram for the variable clock divider circuit of FIG. 5.

FIG. 8 is a timing diagram for variable clock divider circuit 500 of FIG. 5. Specifically, FIG. 8 depicts input clock signal I_CLK, phase-shifted clock signals P_CLK_1 to P_CLK_4, active-low power-on/reset signal !POR, rising-edge control signal R_C, falling-edge control signal F_C, and output clock signal O_CLK. As explained above, phase-shifted clock signal P_CLK_X is phase shifted from input clock signal I_CLK by 90 times X degrees. Phase shifting by 90 degrees is equivalent to time shifting by one-fourth of a clock period. Thus, rising edge 821 is offset by one-fourth of clock period P_I from rising edge 811. Similarly, rising edges 831, 841, and 851 are offset from rising edge 811 by one-half, three-fourths, and one clock period P_I, respectively. Precision rising-edge selection signals PRS_IN (not shown) control multiplexer 720 (FIG. 7) to select one of phase-shifted clock signals P_CLK_1 to P_CLK_4 to be driven as precision rising-edge control signal PRC_OUT. For the timing diagram of FIG. 8, phase-shifted clock signal P_CLK_1 is selected at multiplexer 720. Similarly, precision falling-edge selection signals PFS_IN (not shown) control multiplexer 730 (FIG. 7) to select one of phase-shifted clock signals P_CLK_1 to P_CLK_4 to be driven as precision falling-edge control signal PFC_OUT. For the timing diagram of FIG. 8, phase-shifted clock signal P_CLK_2 is selected at multiplexer 730.

As explained above, rising-edge control signal R_C is used to enable clock divider output generator 520 (FIG. 5) to drive output clock signal O_CLK to a logic high in response to rising edges on precision rising-edge control signal PRC_OUT. Thus, clock divider output generator 520 drives output clock signal O_CLK to logic high in response to active edges of precision falling-edge control signal PFC_OUT only if rising-edge control signal R_C is at the active state (logic high). Consequently, only rising edges 822, 824, and 826 cause clock divider output generator 520 to drive output clock signal O_CLK to logic high. Other rising edges on rising-edge control signal PRC_OUT are ignored by clock divider output generator 520.

Similarly, as explained above, falling-edge control signal F_C is used to enable clock divider output generator 520 to drive output clock signal O_CLK to a logic low state in response to rising edges on precision falling-edge control signal PFC_OUT. Thus, clock divider output generator 520 drives output clock signal O_CLK to logic low in response to active edges of precision falling-edge control signal PFC_OUT only if falling-edge control signal F_C is in the active state (logic high). Consequently, only rising edges 833 and 835 cause clock divider output generator 520 to drive output clock signal O_CLK to logic low state. Other rising edges on precision falling-edge control signal PFC_OUT are ignored by clock divider output generator 520.

Depending on the selection of duty cycle control signals D_CTRL, precision rising-edge selection signals PRS_IN, and precision falling-edge selection signals PFS_IN, the duty cycle of output clock signal O_CLK in this embodiment can range from being at logic high for 1/12 of the clock period of output clock signal O_CLK to being at logic high for 11/12 of the clock period of output clock signal O_CLK. In general, for an embodiment of the present invention configured to divide input clock signal I_CLK by D coupled with a clock phase shifter providing P phase-shifted clock signals, the duty cycle of output clock signal O_CLK can range from being at logic high for 1/(D*P) of the clock period of output clock signal O_CLK to being at logic high for (D*P–1)/(D*P) of the clock period of output clock signal O_CLK.

In the various embodiments of this invention, novel structures have been described for variable clock division circuits. By using a clock divider controller to divide the frequency of an input clock signal, the present invention is able to provide an output clock signal having a frequency equal to the frequency of the input clock signal divided by a selected integer. Further, the present invention can include a precision duty cycle control circuit that adjusts the duty cycle of the output clock signal. The various embodiments of the structures and methods of this invention that are described above are illustrative only of the principles of this invention and are not intended to limit the scope of the invention to the particular embodiments described. For example, in view of this disclosure those skilled in the art can define other flip-flops, clock divider controllers, clock divider output generators, edge-triggered SR circuits, clock phase shifters, active edges, enable logic levels, and so forth, and use these alternative features to create a method, circuit, or system according to the principles of this invention. Thus, the invention is limited only by the following claims.

What is claimed is:

1. A variable clock divider circuit for generating an output clock signal from an input clock signal, the variable clock divider circuit comprising:

a controller coupled to receive the input clock signal and configured to generate a rising-edge control signal having a plurality of active edges, and a falling-edge control signal having a plurality of active edges, the controller having:

a first flip-flop having an input terminal, an output terminal, a set terminal, and a clock input terminal coupled to receive the input clock signal;

a second flip-flop having an input terminal coupled to the output terminal of the first flip-flop, a reset terminal, an output terminal and a clock input terminal coupled to receive the input clock signal;

a third flip-flop having an input terminal coupled to the output terminal of the second flip-flop, a reset terminal, an output terminal, and a clock input terminal coupled to receive the input clock signal;

a first multiplexer having an output terminal coupled to the input terminal of the first flip-flop, a first input terminal coupled to the input terminal of the second flip-flop, and a second input terminal coupled to the input terminal of the third flip-flop; and a power-on/reset line coupled to the set terminal of the first flip-flop, the reset terminal of the second flip-flop, and the reset terminal of the third flip-flop; and an output generator coupled to the controller and providing the output clock signal, the output generator driving a rising edge on the output clock signal in response to active edges of the rising-edge control signal and driving a falling edge on the output clock signal in response to active edges of the falling-edge control signal.

2. The variable clock divider circuit of claim 1, wherein the rising-edge control signal has a rising-edge frequency equal to a input clock frequency of the input clock divided by an integer.

3. The variable clock divider circuit of claim 2, wherein the integer is selected using one or more frequency control signals.

4. The variable clock divider circuit of claim 2, wherein the falling-edge control signal has a falling-edge frequency equal to the rising-edge frequency.

5. The variable clock divider circuit of claim 1, wherein active edges of the rising-edge control signal are offset from active edges of the falling-edge control signal by a duty cycle offset.

6. The variable clock divider circuit of claim 5, wherein the duty cycle offset is equal to an integer times a clock period of the input clock signal.

7. The variable clock divider of claim 1, wherein the output terminal of the second flip-flop drives the rising-edge control signal.

8. The variable clock divider circuit of claim 1, wherein the controller further comprises an output multiplexer having a first input terminal coupled to the output terminal of the first flip-flop, a second input terminal coupled to the output terminal of the second flip-flop, a third input terminal coupled to the output terminal of the third flip-flop, and an output terminal coupled to drive the falling-edge control signal.

9. The variable clock divider circuit of claim 1, wherein the controller further comprises a fourth flip-flop having an input terminal coupled to the output terminal of the third flip-flop, a reset terminal coupled to the power-on/reset line, an output terminal coupled to the first multiplexer, and a clock input terminal coupled to receive the input clock signal.

10. The variable clock divider circuit of claim 1, wherein the output generator comprises an edge-triggered SR circuit.

11. A variable clock divider circuit for generating an output clock signal from an input clock signal, the variable clock divider circuit comprising:

a controller coupled to receive the input clock signal and configured to generate a rising-edge control signal having an active state and an inactive state, and a falling-edge control signal having an active state and an inactive state;

a precision duty cycle control circuit coupled to receive the input clock signal and configured to generate a precision rising-edge signal having a plurality of active edges, and a precision falling-edge signal having a plurality of active edges; and an output generator coupled to the controller and the precision duty cycle control circuit, wherein:

the output generator drives a rising edge on the output clock signal in response to active edges of the precision rising-edge signal when the rising-edge control signal is in the active state of the rising-edge control signal; and the output generator drives a falling edge on the output clock signal in response to an active edge of the precision falling-edge signal when the falling-edge control signal is in the active state of the falling-edge control signal.

12. The variable clock divider circuit of claim 11, wherein:

the precision duty cycle control circuit comprises a clock phase shifter coupled to receive the input clock signal; and the clock phase shifter generates a plurality of phase-shifted clock signals.

13. The variable clock divider circuit of claim 12, wherein the precision duty cycle control circuit further comprises:

a first multiplexer coupled to receive the plurality of phase-shifted clock signals from the clock phase shifter and configured to generate the precision rising-edge signal; and a second multiplexer coupled to receive the phase-shifted clock signals from the clock phase shifter and configured to generate the precision falling-edge signal.

14. The variable clock divider circuit of claim 11, wherein the controller comprises:

a first flip-flop having an input terminal, an output terminal, a set terminal, and a clock input terminal coupled to receive the input clock signal;

a second flip-flop having an input terminal coupled to the output terminal of the first flip-flop, a reset terminal, an output terminal and a clock input terminal coupled to receive the input clock signal;

a third flip-flop having an input terminal coupled to the output terminal of the second flip-flop, a reset terminal, an output terminal, and a clock input terminal coupled to receive the input clock signal;

a first multiplexer having an output terminal coupled to the input terminal of the first flip-flop, a first input terminal coupled to the input terminal of the second flip-flop, and a second input terminal coupled to the input terminal of the third flip-flop; and a power-on/reset line coupled to the set terminal of the first flip-flop, the reset terminal of the second flip-flop, and the reset terminal of the third flip-flop.

15. A method of dividing an input clock signal having an input clock frequency to generate an output clock signal having an output clock frequency, the method comprising the steps of:

generating a first rising-edge control signal having a plurality of active edges;

generating a first falling-edge control signal having a plurality of active edges;

driving a rising edge on the output clock signal for each active edge of the first rising-edge control signal that occurs while a second rising-edge control signal is in an active state;

ignoring active edges of the first rising-edge control signal that occur while the second rising-edge control signal is in an inactive state; and driving a plurality of falling edges on the output clock signal in response to the active edges of the falling-edge control signal.

16. The method of claim 15, wherein a frequency of the rising-edge control signal is equal to the input clock frequency divided by an integer.

17. The method of claim 16, wherein a frequency of the falling-edge control signal is equal to the input clock frequency divided by the integer.

18. The method of claim 15, wherein the second rising-edge control signal is a phase-shifted clock signal based on the input clock signal.

* * * * *